United States Patent
Uchino et al.

[11] Patent Number: 6,163,291
[45] Date of Patent: Dec. 19, 2000

[54] SUCCESSIVE APPROXIMATION ANALOG TO DIGITAL CONVERTER WITH BIT ERROR CORRECTION

[75] Inventors: Osamu Uchino, Chigashiki; Kana Yamasaki; Kohji Hizume, both of Ohta ku, all of Japan

[73] Assignee: Texas Instruments Incorporated, Dallas, Tex.

[21] Appl. No.: 09/010,319

[22] Filed: Jan. 21, 1998

[51] Int. Cl.[7] .................................................. H03M 1/34

[52] U.S. Cl. ............................................ 341/163; 341/155

[58] Field of Search .................................. 341/155, 159, 341/161, 163, 162, 165

[56] References Cited

U.S. PATENT DOCUMENTS

| | | | |
|---|---|---|---|
| 3,729,732 | 4/1973 | Yano | 341/162 |
| 4,641,129 | 2/1987 | Doluca et al. | 341/159 |
| 4,649,371 | 3/1987 | Kolluri | 341/156 |
| 5,057,841 | 10/1991 | Veerhoek et al. | 341/156 |

*Primary Examiner*—Peguy Jean Pierre
*Attorney, Agent, or Firm*—Bret J. Petersen; Frederick J. Telecky, Jr.

[57] ABSTRACT

An A/D conversion method which compares an input analog voltage and a comparison voltage, wherein the comparison voltage range corresponds to the upper half or lower half of the previous comparison voltage range if the determination of the previous bit was normal, and when the previous comparison was abnormal, then the comparison voltage range is outside of the previous comparison voltage range.

6 Claims, 11 Drawing Sheets

SUCCESSIVE APPROXIMATION ANALOG TO DIGITAL CONVERTER WITH BIT ERROR CORRECTION

FIELD OF THE INVENTION

The present invention relates to an A/D conversion method that converts analog voltage data into digital voltage data. In particular, it relates to a successive comparison type of A/D conversion method.

BACKGROUND OF THE INVENTION

Various electronic devices digitalized in recent years with the progress in semiconductor technology that executes the digital signal processing of microprocessors, memory IC, etc. However, the physical quantity of the natural world is an analog quantity, and it is necessary to convert analog signals into digital signals. Therefore conventionally, an A/D convertor was widely used.

Generally, there are various modes of A/D convertors such as the successive comparison type, integration type, oversampling type, etc., but the successive comparison type of A/D convertor is used in the general-purpose products due to the favorable balance between the precision, speed, and cost.

When a successive comparison type of A/D converter in the conventional technology is explained, there are a comparator, a successive comparison register, a control circuit, and a D/A conversion circuit. The D/A conversion circuit forms a comparison voltage DA from the reference voltage $V_{ref}$ by referring to the value of the successive comparison register, and is connected so as to output to the comparator, with the comparator comparing the input voltage $A_{in}$, which is the conversion target, with the input comparison voltage DA and is composed to output the comparison result to the successive comparison register as shown in the block diagram in FIG. 12.

The value of the successive comparison register is changed according to the input comparison result of the comparator, the D/A conversion circuit sets the comparison voltage DA according to the value of the successive comparison register after the change, and is composed for the comparator to execute a comparison between the input voltage $A_{in}$ and the comparison voltage DA that was set. When this type of comparison of the comparator and setting of the D/A conversion circuit are repeatedly executed, conversion of the input voltage $A_{in}$ into digital voltage data with the necessary precision becomes possible.

A method for converting the input voltage $A_{in}$ into digital voltage data of M bits with one comparator using an A/D comparator with the aforementioned constitution will be explained.

First of all, the control circuit starts the operation with the START signal and the following processes are executed.

(1) The successive register is initialized (hereafter "successive comparison register" will be referred to as "register").

(2) "1" is stored in the uppermost order bit $B_m$ of the register.

(3) One comparison voltage DA is set based on the value of the register. The value of the register at this time is "1" in only the uppermost order bit $B_m$, so the comparison voltage DA is set to $½ V_{ref}$.

(4) The input voltage $A_{in}$ and comparison voltage DA are compared and the comparison result is obtained.

(5) If the comparison result is 1, namely, if input voltage $A_{in}$ is more than comparison voltage DA, uppermost order bit $B_m$ of the register value is left as 1. If the comparison result is 0, namely, if input voltage $A_{in}$ is less than comparison voltage DA, uppermost order bit $B_m$ of the register value is made 0.

(6) "1" is stored in second bit $B_{m-1}$, of the register. As a result, the value of the register becomes "1100 . . . 0" or "0100 . . . 0."

(7) Second comparison voltage DA is set based on the content of said register.

If the value of the register is "1100 . . . 0," comparison voltage DA is set to $¾ V_{ref}$; if it is "0100 . . . 0," comparison voltage DA is set to $¼ V_{ref}$.

(8) The comparison result is obtained by comparing input voltage $A_{in}$ with comparison voltage DA that was set.

(9) Second bit $B_{m-1}$, is decided according to the process in 5 above based on the comparison result.

(10) "1" is stored in third bit $B_{m-2}$ of the register and the same processes as those subsequent to 7 are repeatedly executed.

By repeating said processes, the value of the register that indicates the digital voltage data of input voltage $A_{in}$ becomes high in precision by 1 bit each. When the processing of last bit $B_1$ is completed and the register value of the M bits is decided, the control circuit outputs an END signal, the value of the register thereof is extracted as digital voltage data of M bit precision, and the A/D conversion process ends.

Therefore, it is possible to obtain digital voltage data of high precision in the successive comparison type of A/D converter even if the number of comparators and comparison voltage setting circuits is minimal.

Incidentally, it is necessary to repeatedly execute the comparison operation for the precision level of the digital voltage data in a successive comparison type of A/D converter. In the aforementioned example, M times of comparison operations are necessary since digital voltage data of M bits are obtained with one comparison.

In this case, the setting frequency of comparison voltage DA is also M times but comparison voltage DA is set based on the comparison result, so if the comparison result errs even once, all the comparison voltages set thereafter become erroneous. Therefore, the digital voltage data in case there is a comparison miss become that which does not correctly express the value of the input voltage.

In this type of comparison miss, there are those originating in erroneous operation of the comparator or an erroneous voltage contained in comparison voltage DA, but in addition to these, there are cases of originating in the voltage value of input voltage $A_{in}$ fluctuating during the time that the comparison operation is being executed repeatedly.

Input voltage $A_{in}$ is normally fed from the sample-hold circuit provided in front of the A/D converter, but it is known that oscillation as in the graph indicated with code ($A'_{in}$) in FIG. 13 is observed depending on the operational state of said sample-hold circuit.

Therefore, in the conventional technology, the A/D converter is made to wait until time ($T_0$), at which time the oscillation attenuates sufficiently after sample hold of input voltage $A_{in}$ is executed and the comparison operation is started after input voltage $A_{in}$ stabilizes.

However, a parasitic capacity exists within the comparator so two input terminals of the comparator are connected by said parasitic capacity. Comparison voltage DA input to one input terminal in this type of comparator is changed in voltage value each time a comparison operation is executed, so when said change in comparison voltage DA influences the other input terminals, the setting of comparison voltage DA is influenced even after the oscillation has been sufficiently attenuated, input voltage $A_{in}$ connected to the other input terminal fluctuates, and a comparison miss may be generated.

Incidentally, the voltage value of comparison voltage DA fluctuates greatly immediately after the start of the comparison operation (e.g., the amount of change in the comparison voltage between the first time and the second time is a size of ¼ $V_{ref}$), so the amount of fluctuation immediately after the start of the comparison operation becomes large even in input voltage $A_{in}$, which is influenced by it. As was noted above, even after the vibration of input voltage $A_{in}$ has been attenuated, there is a tendency for a comparison miss to be generated immediately after starting the comparison operation.

Therefore, a countermeasure was taken even in the conventional technology. When setting comparison voltage DA, the upper limit voltage which added and a lower limit voltage that which subtracted a prescribed voltage value to said comparison voltage DA are set; after the comparison result of input voltage $A_{in}$ and comparison voltage DA is obtained, input voltage $A_{in}$ is successively compared with the upper limit voltage and the lower limit voltage, and whether there is an inconsistency between the comparison results of the voltages was checked.

However, the change in comparison voltage DA becomes less each time setting is executed and the change in comparison voltage DA is minimal near the end of the M times of comparison operations (e.g., the amount of change in the comparison voltage between the 9th time and the 10th time is $\frac{1}{1024} V_{ref}$).

Therefore, when the upper limit voltage and the lower limit voltage are set to be able to accommodate the great fluctuation in initial input voltage $A_{in}$ at the start of the comparison operation, a comparison miss according to the trace fluctuation in comparison voltage DA cannot be detected since the oscillation of input voltage $A_{in}$ also gradually becomes less, a trace error included in the obtained digital voltage data is created, and a problem is generated.

Also, in this type of conventional technology, the conversion time becomes long due to requiring an excessive waiting time, redoing the comparison when a comparison miss is detected, etc., so it is unsuitable for the A/D converters of the recent years that require high speed operation.

The present invention was made to solve said inconveniences in the conventional technology, and the objective is to provide a technology capable of accurately converting input voltage $A_{in}$ into digital voltage data.

Also, the objective is to provide a technology that can obtain a correct digital voltage data in a short conversion time.

SUMMARY OF INVENTION

According to an embodiment of the present invention, the input analog voltage, which is the target of the A/D conversion, is compared with multiple preset comparison voltages using a comparator and the digital value is obtained from the comparison result thereof, so the input voltage can be converted into digital voltage data from the digital value by repeatedly executing setting and comparison of the voltage value of the comparison voltage based on said comparison result.

If said digital value is d bits (d is a positive number), $2^d-3$ digital values in $2^d-1$ comparison voltages among the multiple comparison voltages are used as the calculating comparison voltages when obtaining the digital value and the remaining two comparison voltages can be used as the discriminating comparison voltages for discriminating as to whether the comparison result is normal or abnormal.

At least two discriminating comparison voltages are necessary at the top and bottom of the range provided with calculating comparison voltages, and is normally an even number.

It was composed so that if the comparison result from having compared the input analog voltage with said comparison voltage is abnormal, correction of the digital value obtained from the calculating comparison voltage is executed so that correct digital voltage data are obtained. Therefore, it is not necessary to provide a waiting time even if there is oscillation in the input analog voltage.

Regarding this type of A/D conversion, the voltage difference between multiple comparison voltages is made minimal when resetting the comparison voltage, so the voltage difference becomes smaller each time the comparison voltage is reset. Therefore, the voltage difference is great at the beginning of the comparison and is minimal by the end of the comparison, so it is possible for the discriminating comparison voltage to follow the fluctuation in the input analog voltage, which becomes great at the beginning and minimal at the end.

If the voltage difference between the adjacent comparison voltages among the comparison voltages is made to be the same when setting the comparison voltage in this way, in addition to the evaluation of the comparison result becoming easy, recovery to the normal state is easy when the comparison result is abnormal.

If the the number of bits being determined is d bits, the voltage difference between the comparison voltages is made $\frac{1}{2}^d$ each time the voltage value is set, so evaluation of the comparison result becomes even easier. Also, even if there is an abnormality, return to the same state as when there was no abnormal comparison is easy.

With regard to the returning method when the comparison result is abnormal, it is executed by estimating the value of the true input analog voltage from the comparison result of the discriminating comparison voltage.

The relationship between this type of calculating comparison voltage and discriminating comparison voltage is for the voltage value set with the discriminating comparison voltage to be at positions at the top and bottom of the range set with the calculating comparison voltage. An explanation will be given using FIG. 11($a$) regarding the case when d=2 and when there is one calculating comparison voltage and two discriminating comparison voltages.

Code $DA_2$ in FIG. 11($a$) expresses said calculating comparison voltage; if the voltage difference between the comparison voltage is expressed with code W, the case in which two discriminating comparison voltages $DA_1$ and $DA_3$ ($DA_1<DA_2$, $DA_2<DA_3$) are set at voltages of ±W with calculating comparison voltage $DA_2$ at the center is indicated.

In this example, initial voltage values of discriminating comparison voltages $DA_1$ and $DA_3$ are set at the minimum voltage value (=0) and maximum voltage value (=$V_{ref}$) that the input analog voltage can take. Initial voltage difference W is ½ $V_{ref}$.

If voltage difference W is made ½ every time a comparison operation is executed and if calculating comparison voltage $DA_2$ is set to be the center voltage of voltage difference W in the direction approaching input analog voltage $A_{in}$ every time it is reset, input analog voltage $A_{in}$ is always within a range (range of 2W) of ±W with calculating comparison voltage $DA_2$ as the center if there is no fluctuation in input analog voltage $A_{in}$ and if there is no comparison miss. Therefore, even if discriminating comparison voltages $DA_1$ and $DA_3$ are not used, converting into an accurate digital voltage data is possible as long as the input analog voltage is within said range.

However, whether input analog voltage $A_{in}$ is in the range of calculating comparison voltage $DA_2±W$ cannot be discriminated unless there is the comparison result of discriminating comparison voltages $DA_1$ and $DA_3$.

If input analog voltage $A_{in}$ indicates that it is not in the range of $DA_2±W$, it is apparent that a comparison miss has been generated.

In this case, it is known that fluctuation of input analog voltage $A_{in}$ gradually becomes smaller so even if there is a comparison miss, it is possible to assume that the true value of input analog voltage $A_{in}$ is not distanced by more than voltage difference W from the voltage value of input analog voltage $A_{in}$ when there was a comparison miss. Therefore, it is either $$DA_1-W<A_{in}<DA_1$$

or $$DA_3<A_{in}<DA_3+W$$

even if there was a comparison miss. When each of these voltage ranges is made into the allowable error range, the comparison result eventually becomes normal if the next calculating comparison voltage $DA_2$ is set to be positioned at the center of one of the suitable error ranges.

FIG. 11(b) is a case in which multiple calculating comparison voltages are set and the discriminating comparison voltages are set two each at the top and bottom; if the number of calculating comparison voltages is m, it is when input analog voltage $A_{in}$ is positioned in a range of width (m+1)×W created by each calculating comparison voltage that the comparison result becomes normal when input analog voltage $A_{in}$ is compared with each comparison voltage, and a correct digital voltage data is obtained even when correction is not made.

If input analog voltage $A_{in}$ is positioned outside of said range, the comparison result becomes abnormal; however, even in this case, the allowable error range capable of correcting the voltage value of each comparison voltage and the digital value is a range having a top and bottom total 4×W of the width (m+1)×W range (when the discriminating comparison voltage is two at the top and bottom).

If the comparison result is abnormal, a comparison miss can be corrected by positioning the calculating comparison voltage, which the next time becomes the center of one of the suitable ranges within 4× each W range of the allowable error range.

Figure 1:
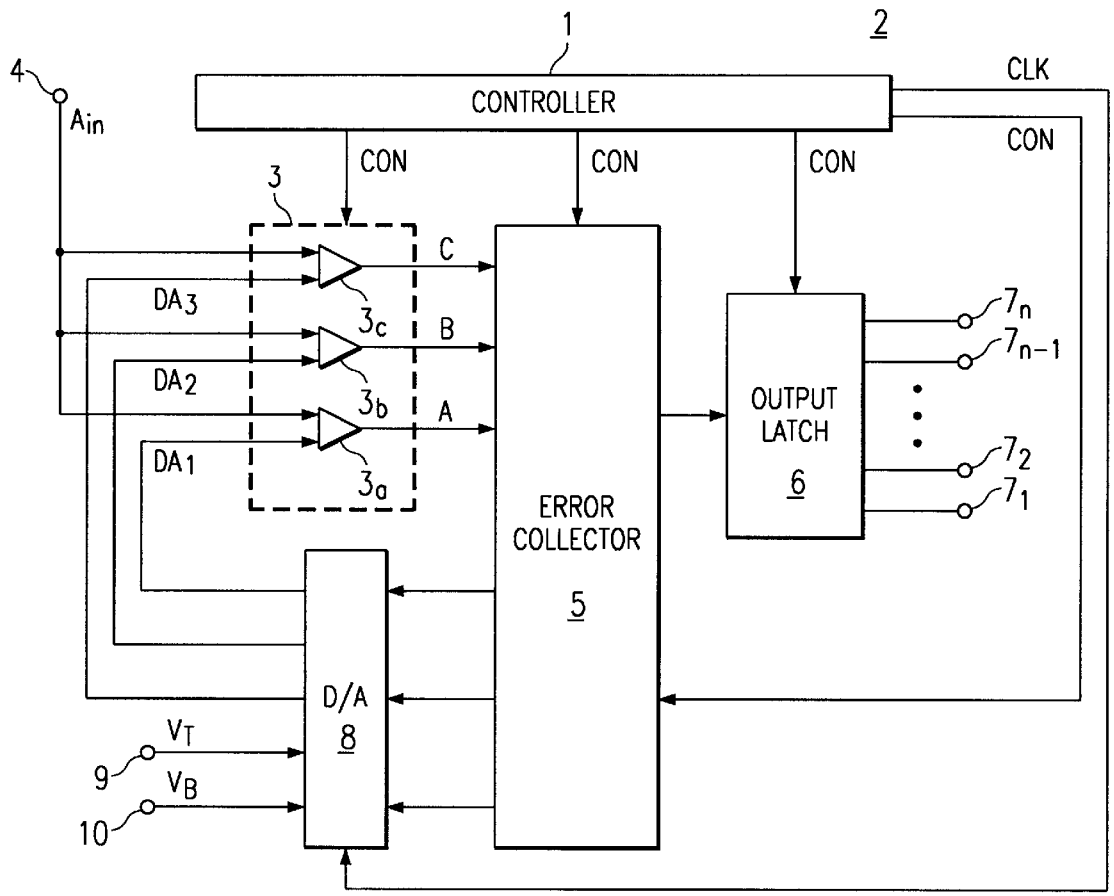
FIG. 1: A block diagram of an A/D converter in the first example related to the present invention.
Figure 11A:
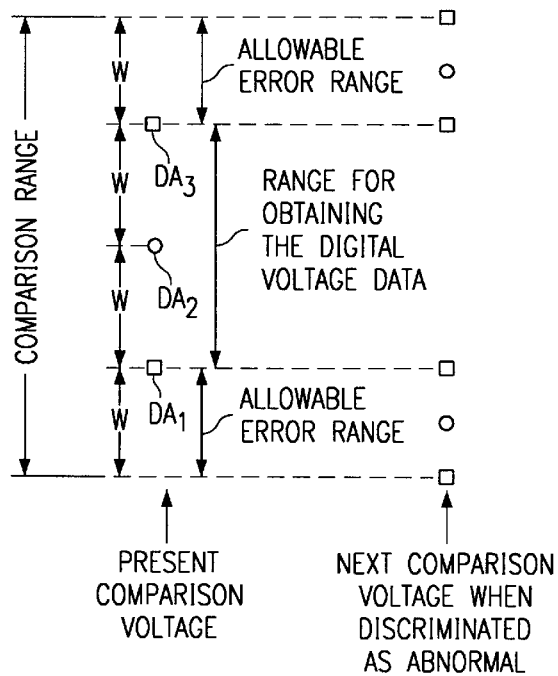
FIGS. 11: (a) and (b): Figures for explaining the comparison range, range for obtaining the digital voltage data, and the allowable error range.
Figure 11B:
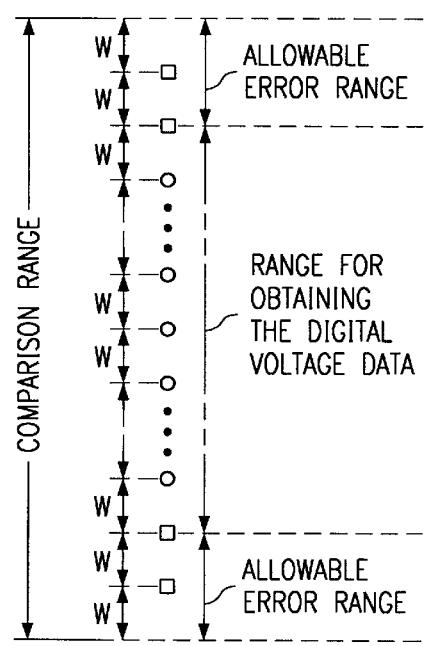

REFERENCE NUMERALS AS SHOWN IN THE DRAWINGS 2, 12 represent A/D converters, 3, 13 comparators, 5, 15 arithmetic circuits (error collectors), 8, 18 comparison voltage setting circuits (D/A conversion circuits), $A_{in}$ input voltage, $DA_1$–$DA_5$ comparison voltages.

DESCRIPTION OF EMBODIMENTS

The A/D conversion method in the present invention will be explained below.

Code 2 in FIG. 1 is a block diagram showing an A/D converter in an applied mode of the present invention. This A/D converter 2 has controller 1 that starts the operation with the input of the START signal, comparator 3 that is built in with multiple unit comparators, error collector 5 that is the arithmetic circuit built in with a register (successive comparison register), output latch 6 that holds the value of said register, and D/A conversion circuit 8 that is the comparison voltage setting circuit.

Input terminal 4 is provided to comparator 3, sample-hold circuit not shown in the figure in the previous step samples the analog voltage, and is composed to be output to said input terminal 4 as input voltage $A_{in}$. On the other hand, terminals $7_1$–$7_n$ are provided parallel to output latch 6 and are composed for the value of the register, which is the A/D conversion result of input voltage $A_{in}$, to be output 1 bit each in parallel from each terminal $7_1$–$7n$ via output latch 6.

Two reference voltages ($V_B$) and ($V_T$) ($V_B<V_T$) are input to D/A conversion circuit 8, being composed for said reference voltages ($V_B$) and ($V_T$) to be impressed and for the potential to be divided between the resistance ladder not shown in the figure provided within D/A conversion circuit 8. A switch element not shown in the figure is connected to the resistance ladder, and D/A conversion circuit 8 is composed to control said switch element, extract the voltage of a value complying to the signal from error collector 5 among the voltages created by pressure dividing the differential voltage between reference voltages ($V_B$) and ($V_T$), and output separately as three comparison voltages $DA_1$–$DA_3$ ($DA_1<DA_2<DA_3$).

Each comparison voltage $DA_1$–$DA_3$ is input respectively to unit comparators 3a–3c provided within comparator 3; each unit comparator 3a–3c is composed to compare input voltage $A_{in}$ input from input terminal 4 respectively with each comparison voltage $DA_1$–$DA_3$ and to output the results to error collector 5 as comparison results A, B, and C.

In this example, the digital value is calculated by using center comparison voltage $DA_2$ among comparison voltages $DA_1$–$DA_3$. Comparison voltages $DA_1$ and $DA_3$ on both ends are used as the discriminating comparison voltages, and whether or not the comparison result is normal or abnormal is discriminated using these comparison results $DA_1$ and $DA_3$. The register within error collector 5 decides the necessary bit level at a prescribed position as the successive digital value if the comparison result is normal, as will be noted later, and the register value is output as a conversion result to the digital voltage data of input voltage $A_{in}$ via output latch 6 when all bits are decided.

Clock generator and control circuit are built into controller 1 and composed to output clock signal CLK and various control signals CON to other circuits, with each circuit being operated with the timing complying with clock signal CLK.

Figure 2:
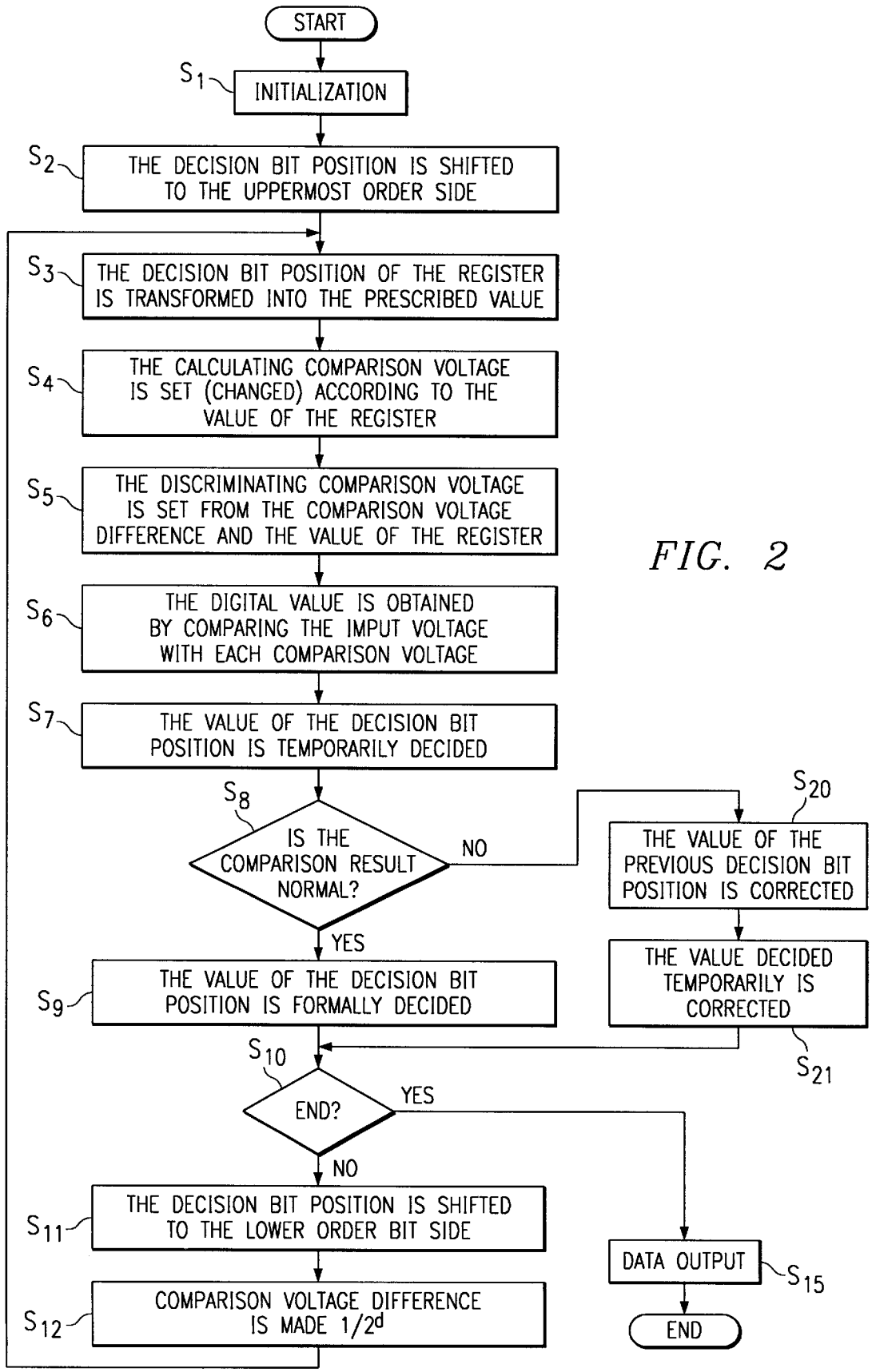
FIG. 2: A flow chart for explaining the operation of said A/D converter.

The operation of this A/D converter 2 is shown in the flow chart of FIG. 2. An explanation will be given regarding the case of converting input voltage $A_{in}$ into digital voltage data of 4 bits using calculating comparison voltage $DA_2$ and discriminating comparison voltages $DA_1$ and $DA_3$.

An assumption will be made that, presently, reference voltage $V_{ref}$ is defined as $$V_{ref} = V_T - V_B$$

and $V_B$ is zero V ($V_{ref}=V_T$) for simplicity.

In Step S1, controller 1 outputs an initialization signal with respect to the circuit within A/D converter 2 in addition to error collector 5, then each part is initialized. The register of 4 bits within error collector 5 is set to "0000."

In this A/D converter 2, the voltage difference between comparison voltages $DA_1$–$DA_3$ is set to be equal; if this voltage difference is referred to as the "comparison voltage difference," the comparison voltage difference is initially set to ½ $V_{ref}$ in Step $S_1$.

Among the values of the register within error collector 5, the position of the bit for deciding the digital value calculated from the comparison result will be referred to as the "deciding bit position." Also, the deciding bit position will be considered to be decided for each bit from the highest order bit position within the register towards the lowest order bit position. The deciding bit position is set at the highest order bit in Step $S_2$.

In Step $S_3$, the value of the deciding bit position (here the highest order bit) of the register is made equal to "1."

In Step $S_4$, calculating comparison voltage $DA_2$ is set based on the value of the register.

In this A/D converter 2, the voltage values correspond one on one with

1/16 $V_{ref}$, 2/16 $V_{ref}$, 3/16 $V_{ref}$, . . . , 15/16 $V_{ref}$ beforehand with respect to the values of the 4 bit register "0001," "0010," "0011," . . . "1111" Here the content of the register is "1000," so calculating comparison voltage $DA_2$ is set to 8/16 $V_{ref}$ ($=½ V_{ref}$), which corresponds with the voltage value thereof within D/A conversion circuit 8. Namely, it becomes $DA_2 = ½ V_{ref}$ Next, in Step $S_5$, the voltage value of discriminating comparison voltages $DA_1$ and $DA_3$ is set to a voltage value that varies by only the level of the comparison voltage difference ($=½ V_{ref}$) with respect to calculating comparison voltage $DA_2$ which becomes the center. Ultimately, comparison voltages $DA_1$–$DA_3$ are set at $DA_3 = 2/2\ V_{ref}$
$DA_2 = ½\ V_{ref}$
$DA_1 = 0/2\ V_{ref}$ The voltage value thereof is output from D/A conversion circuit 8, and is input to each unit comparator 3a–3c.

Figure 3:
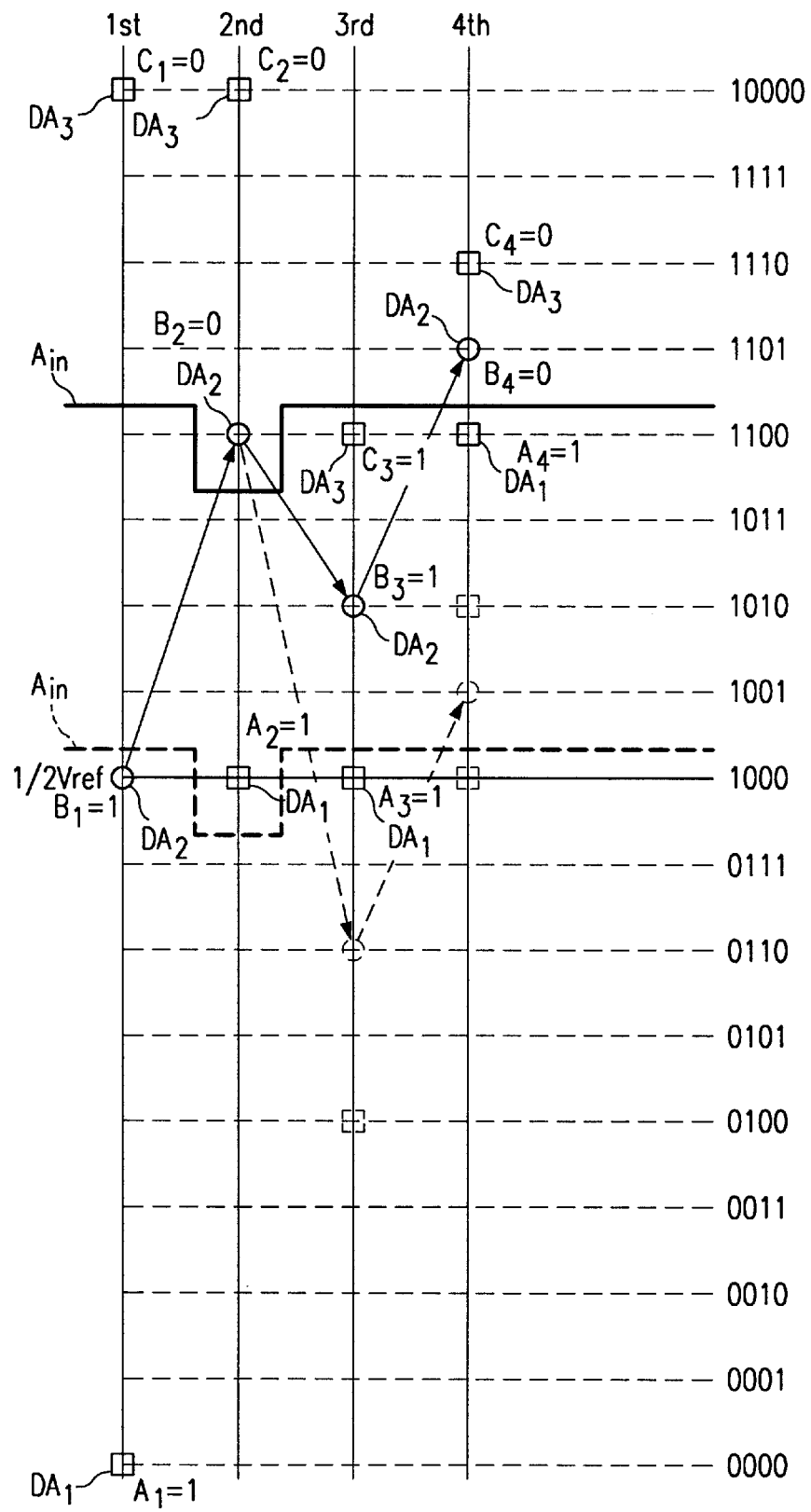
FIG. 3: A figure for explaining the transition in the comparison voltage of said A/D converter.

Calculating comparison voltage $DA_2$ is indicated with the ○0 plot and discriminating comparison voltages $DA_1$ and $DA_3$ and indicated with the □ plot in FIG. 3. Setting of comparison voltages $DA_1$–$DA_3$ this time is done first and is shown as the 1st position in FIG. 3. In this example, comparison voltage $DA_2$ and comparison voltages $DA_1$ and $DA_3$ are set in different steps ($S_4$, $S_5$), but setting can be executed in the same step.

In Step $S_6$, each unit comparator 3a–3c compares input voltage $A_{in}$ with each comparison voltage $DA_1$–$DA_3$ and outputs the results to error collector 5 as first comparison results $A_1$, $B_1$, and $C_1$.

In this example, each comparison result $A_1$, $B_1$ and $C_1$ is made equal to "1" if input voltage $A_{in}$ is greater than each comparison voltage $DA_1$–$DA_3$, and is equal to "0" if less.

In Step $S_7$, the value of output result $B_2$ of calculating comparison voltage $DA_2$ at this time is temporarily decided as the value of the deciding bit position (here, the uppermost order bit).

Next, whether the comparison result is normal or abnormal is discriminated in Step $S_8$. If the discrimination result is normal, the transition is made from Step $S_8$ to Step $S_9$. If, on the other hand, the discrimination is made as being abnormal, the transition is made to Step $S_{20}$. If an assumption is made that input voltage $A_{in}$ is always at a potential between $V_B$ and $V_T$ and a comparison miss is not generated in the first comparison, the first comparison result always becomes normal and the transition is always made to Step $S_9$.

In Step $S_9$, the value of the deciding bit position which was temporarily decided, is decided as being formal as is and the value of the register is verified. The process in aforementioned Step $S_7$ is not always necessary and can be only the process in this Step $S_9$.

Next, in Step $S_{10}$, it is discriminated as to whether all the values of the register have been decided. If there is a bit that has not been decided, the transition is made to Step $S_{11}$; if all have been decided, the transition is made to Step $S_{15}$. Here, only the uppermost order bit has been decided, so the transition is not made to Step $S_{15}$ and the transition is made to Step $S_{11}$.

In Step $S_{11}$, the deciding bit position is shifted to the lower order bit side. This A/D comparator 2 decides the value of the register at 1 bit each, so the deciding bit position is shifted 1 bit to the lower order bit side from the highest order bit and is positioned at the second bit.

Next, in Step $S_{12}$, the next comparison voltage is set by making the present comparison voltage difference $½^d$. In this embodiment, d is 1 and the comparison voltage difference is made equal to ½, so the next comparison voltage difference becomes ¼ $V_{ref}$.

Next, the process is returned to Step S3. In this Step $S_3$, the value of the register at the deciding bit position (second bit from the uppermost order) is made equal to "1."

In Step $S_4$, the value of calculating comparison voltage $DA_2$ is set based on the value of the register.

If a case in which the value of the uppermost order bit is "1" is explained first, the value of the second bit is made equal to "1" in Step $S_3$, so the value of the register becomes "1100." The voltage value corresponding to "1100" is ¾ $V_{ref}$ and calculating comparison voltage $DA_2$ is set to $DA_2 = ¾ V_{ref}$ in Step $S_4$.

On the other hand, comparison voltage difference W is ¼ $V_{ref}$ and discriminating comparison voltages $DA_1$ and $DA_3$ are set to $DA_3 = 4/4 V_{ref}$
$DA_1 = 2/4 V_{ref}$ in Step $S_5$. These comparison voltages $DA_1$–$DA_3$ are indicated at the 2nd position in FIG. 3.

Next, if a case in which the uppermost order bit is "0" is explained, the value of the second bit is set to "1" even in this case so the value of the register becomes "0100." The voltage value corresponding to "0100" is ¼ $V_{ref}$, the comparison voltage difference is ¼ $V_{ref}$, and comparison voltages $DA_1$–$DA_3$ are set to $DA_3 = ¾ V_{ref}$
$DA_2 = ½ V_{ref}$
$DA_1 = 0/4 V_{ref}$ In any case, unit comparators $3a$–$3c$ respectively compares input voltage $A_{in}$ with comparison voltages $DA_1$–$DA_3$ in following Step $S_6$ and output the results as second comparison results $A_2$, $B_2$, and $C_2$.

In Step $S_7$, the value of comparison result $B_2$ is temporarily decided as the value of the deciding bit position (second position from the uppermost order).

In the next Step $S_8$, the normality of the comparison result is discriminated. If input voltage $A_{in}$ is within the range of the present comparison voltages $DA_1$–$DA_3$, the discrimination is made as being normal and the transition is made to Step $S_9$.

On the other hand, if the present (second) comparison result ($A_2$) is "0" or if the comparison result ($C_2$) is "1," input voltage $A_{in}$ is not within the range of the present comparison voltages $DA_1$–$DA_3$, the comparison result is discriminated as abnormal, and the transition is made to the correction routine in Step $S_{20}$.

Here, the assumption will be made that the comparison result is normal and the transition is made to Step $S_9$ from Step $S_8$. In Step $S_9$, the value of the deciding bit position (second bit position) is formally decided as is.

Next, the transition is made to Step $S_{10}$, and it is discriminated whether it is the end or not. Here, it is not the end so the transition is made to Step $S_{11}$. In Step $S_{11}$, the deciding bit position is shifted to the lower order side by just 1 bit and is positioned at the third bit. The comparison voltage difference is halved (⅛ $V_{ref}$) and the process is returned to Step $S_3$.

In Step $S_3$, the value of the deciding bit position (third bit) of the register is made equal to "1."

If the values of the upper order 2 bits equal "11," the value of the register becomes "1110" and calculating comparison voltage $DA_2$ is set to voltage ⅞ $V_{ref}$ corresponding to the value of said register in Step $S_4$. Namely, it becomes $DA_2 = ⅞ V_{ref}$ Next, in Step $S_5$, discriminating comparison voltages $DA_1$ and $DA_3$ are set to voltage values in which the comparison voltage difference (=⅛ $V_{ref}$) has been varied with respect to the value of calculating comparison voltage $DA_2$. Ultimately, comparison voltages $DA_1$–$DA_3$ are set to $DA_3 = 8/8 V_{ref}$
$DA_2 = 7/8 V_{ref}$
$DA_1 = 6/8 V_{ref}$ On the other hand, if the values of the upper order 2 bits equal "10," the value of the register becomes "1010" if the value of the third bit is "1" and comparison voltages $DA_1$–$DA_3$ are set to $DA_3 = 6/8 V_{ref}$
$DA_2 = 5/8 V_{ref}$
$DA_1 = 4/8 V_{ref}$ It is the same when the values of the upper order 2 bits equal "01" or "00," with the value of the register becoming "0110" and "0010" respectively. In the case of "0110," it is set to $DA_3 = 4/8 V_{ref}$
$DA_2 = 3/8 V_{ref}$
$DA_1 = 2/8 V_{ref}$ In the case of "0010," it is set to $DA_3 = 2/8 V_{ref}$
$DA_2 = 1/8 V_{ref}$
$DA_1 = 0/8 V_{ref}$ Regardless of what values comparison voltages $DA_1$–$DA_3$ are set to, unit comparators $3a$–$3c$ compare input voltage $A_{in}$ with set comparison voltages $DA_1$–$DA_3$ in the following Step $S_5$ and output third comparison results $A_3$, $B_3$, and $C_3$. Among these, comparison result $B_3$ is chosen as the value of deciding bit position (third bit) of the register.

When the value of the register is thus decided 1 bit each using comparison result (B) and the value of the lowermost order bit (fourth bit) is formally decided, the transition is made to Step $S_{15}$ from Step $S_{10}$. The content of said register is extracted as digital voltage data via output latch 6 when the controller outputs the END signal to the outside and the conversion process ends.

Above, a case in which the comparison result is discriminated as normal was explained, but now an explanation will be given regarding the process when the comparison result is discriminated as abnormal in Step $S_8$ and the transition is made to the correction routine in Step $S_{20}$.

This routine is used for correcting the bits at positions other than the uppermost order bit; when the transition is made to this correction routine, it is a case in which input voltage $A_{in}$ has deviated from the range of comparison voltages $DA_3$–$DA_1$, so it is a case of being $A_{in} < DA_1$ or $DA_3 < A_{in}$ and is a case in which the comparison result A is "0" (in this case, comparison results A–C all become "0") or comparison result C is "1" (in this case, comparison results A–C all become "1").

If comparison result A is "0," the true value of input voltage $A_{in}$ is presumed to be in the range of $$DA_1 - W < A_{in} < DA_1$$

and processing is executed by setting the range of the next comparison voltages $DA_1$–$DA_3$ to the range of said $DA_1$–W–$DA_1$.

On the other hand, if comparison result (C) is "1," the true value of input voltage $A_{in}$ is assumed to be in the range of $$DA_3 < A_{in} < DA_3 + W$$

and processing is executed by setting the range of the next comparison voltages $DA_1$–$DA_3$ to the range of said $DA_3$—$DA_3$+W.

In order to set the next comparison voltages $DA_1$–$DA_3$ as noted above, "1" is subtracted from the value of the bit position previously decided in Step $S_{20}$ if comparison result (A) is "0," with the value of the register being corrected by making the value of the present deciding bit position equal to "1" in Step $S_{21}$. On the other hand, if comparison result (C) is "1," "1" is added to the value of the bit position previously decided in Step $S_{20}$ and the value of the register is corrected by making the value of the present deciding bit position equal "0" in Step $S_{21}$.

An explanation will be given by showing a concrete example. If it becomes $A_{in} < {}^{12}\!/_{16}\ V_{ref}$ during the second comparison (2nd in FIG. 3) in spite of the fact that the true value of input voltage $A_{in}$ is ${}^{12}\!/_{16}\ V_{ref} < A_{in} < {}^{13}\!/_{16}\ V_{ref}$ as indicated with the solid line in FIG. 3, it means that it has been made into $A_{in} < DA_2$ when it should have been made into $DA_2 < A_{in}$ during the second comparison.

In third comparison (3rd in FIG. 3), comparison voltages $DA_1$–$DA_3$ are set to $DA_3 = {}^{6}\!/_{8}\ V_{ref}$
$DA_2 = {}^{5}\!/_{8}\ V_{ref}$
$DA_1 = {}^{4}\!/_{8}\ V_{ref}$ and becomes $DA_1 < DA_2 < DA_3 < A_{in}$ when a comparison with input voltage $A_{in}$ is executed so third comparison results $A_3$, $B_3$, and $C_3$ all become "1."

If comparison result $C_3$ is "1," the comparison result in Step $S_8$ is discriminated as abnormal, so the transition is made to Step $S_{20}$. At this time, the value of the register is "1010," but "1" is added to the value of the bit position previously decided (2nd), so the value of the register becomes "1110" in this Step $S_{20}$.

Next, when the value of the present (3rd) deciding bit position is made equal to "0" in Step $S_{21}$, the value of the register is corrected to "1100," then the process returns to Step $S_{10}$.

When the decision bit position is shifted, the comparison voltage difference is made equal to $V_{ref}/16$, the process returns to Step $S_3$ in Steps $S_{11}$, and $S_{12}$, the fourth bit of the deciding bit position is made equal to 1, and the value of the register becomes "1101." In Step $S_4$, center comparison voltage $DA_2$ is set to $DA_2 = {}^{13}\!/_{16}\ V_{ref}$ based on the value of said register; then when set to $DA_3 = {}^{14}\!/_{16}\ V_{ref}$
$DA_1 = {}^{12}\!/_{16}\ V_{ref}$ in the next Step $S_5$, it becomes $DA_1 < A_{in} < DA_2 < DA_3$ According to the process above, the true value of input voltage $A_{in}$ is kept within the range of comparison voltages $DA_1$–$DA_3$.

Next, another comparison-miss processing procedure will be concretely explained. An assumption will be made that it has become $A_{in} < {}^{8}\!/_{16}\ V_{ref}$ during the second comparison (2nd in FIG. 3) in spite of the fact that input voltage $A_{in}$ is ${}^{8}\!/_{16}\ V_{ref} < A_{in} < {}^{9}\!/_{16}\ V_{ref}$ as indicated with the broken line in FIG. 3, and what should have been made into $DA_1 < A_{in}$ during the second comparison is made into $A_{in} < DA_1$.

When the comparison result is discriminated as abnormal in Step $S_8$ and the transition is made to Step $S_{20}$, the value of the register that was "1100" in the second (2nd) comparison is corrected to "0100" in Steps $S_{20}$ and $S_{21}$ (there is an overflow due to carryover). Thereafter, the value of the register is made equal to "0110" when the process returns to Step $S_3$ via Steps $S_{10}$, $S_{11}$, and $S_{12}$, then third comparison voltages $DA_1$–$DA_3$ are set to $DA_3 = {}^{8}\!/_{16}\ V_{ref}$
$DA_2 = {}^{6}\!/_{16}\ V_{ref}$
$DA_1 = {}^{4}\!/_{16}\ V_{ref}$ in Steps $S_{12}$, $S_3$, $S_4$, and $S_5$.

However, input voltage $A_{in}$ is higher than all of the set comparison voltages $DA_1$, $DA_2$, and $DA_3$ so comparison results $A_3$, $B_3$, and $C_3$ all become "1" when the third (3rd) comparison is executed, and even this third comparison becomes a comparison miss. Therefore, it is discriminated that the comparison result is abnormal in Step $S_8$ and the transition is made to Step $S_{20}$. The value of the register at this time is "0110," but it is corrected to "1000" via Steps $S_{20}$ and $S_{21}$.

Thereafter, when fourth comparison voltages $DA_1$–$DA_3$ are set to $DA_3 = {}^{10}\!/_{16}\ V_{ref}$
$DA_2 = {}^{9}\!/_{16}\ V_{ref}$
$DA_1 = {}^{8}\!/_{16}\ V_{ref}$ in Steps $S_{10}$, $S_{11}$, $S_{12}$, and $S_3$–$S_5$, input voltage $A_{in}$ is kept within the range of comparison voltages $DA_1$–$DA_3$ that were set the fourth time.

As explained above, the comparison result (1 or 0) of calculating comparison voltage $DA_2$ is used as the value of the register deciding bit position, input voltage $A_{in}$ is decided 1 bit each in the first comparison, and the precision of the digital voltage data is improved 1 bit each in this embodiment. However, even if there is a comparison miss midway, it is possible to obtained the correct digital voltage data without increasing the comparison frequency.

Figure 4:
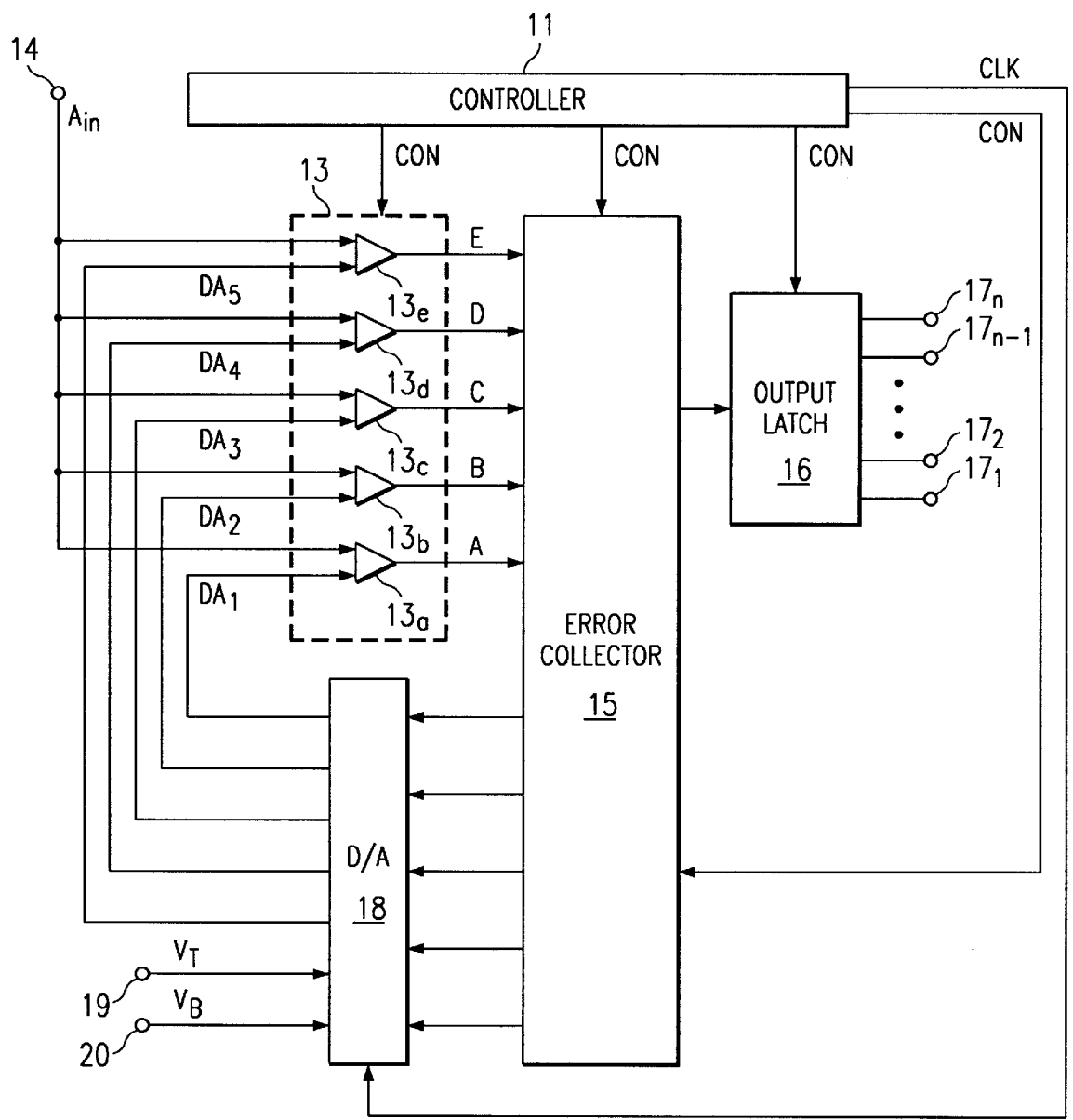
FIG. 4: A block diagram of an A/D converter in the second example related to the present invention.

Next, an A/D converter in another applied mode of the present invention will be explained. Aforementioned A/D comparator 2 enhanced the precision 1 bit each by deciding the digital voltage data at 1 bit each, but the A/D converter indicated with the number 12 in FIG. 4 makes the decision at 2 bits each.

This A/D converter 12 has the same constitution as aforementioned A/D converter 2, a sample-hold circuit of the prior step not shown in the figure, is connected to input terminal 14 connected to comparator 13, and said sample-hold circuit is composed to sample the analog voltage and to output the results to input terminal 14 as input voltage $A_{in}$. On the other hand, terminals $17_1$–$17_n$ are connected in parallel to output latch 16 and are composed such that the digital voltage data, which is the result of having A/D converted input voltage $A_{in}$ to be output at 1 bit each in parallel via output latch 16 from terminals $17_1$–$17_n$ as the value of the register within error collector 15.

Reference voltages $V_T$ and $V_B$ ($V_T > V_B$) input to D/A conversion circuit 18 are pressure divided by the resistance ladder provided within D/A conversion circuit 18; even this A/D converter 12 is composed such that the comparison voltage of the necessary voltage value can be obtained.

Five unit comparators 13a–13e are provided within comparator (13) and are composed for five comparison voltages $DA_1$–$DA_5$ ($DA_1 < DA_2 < DA_3 < DA_4 < DA_5$) to be output individually from D/A conversion circuit 18 with respect to unit comparators 13a–13e.

Input voltage $A_{in}$ from input terminal (14) is also input to unit comparators 13a–13e, with unit comparators 13a–13e being composed to compare said input voltage $A_{in}$ with each comparison voltage $DA_1$–$DA_5$, and to output the results to error collector 15 as comparison results A, B, C, D, and E.

A register is provided within error collector 15 and as will be noted later, with digital values in the following table

TABLE I

| Comparison Result | | | Values of the 2 Bits | |
|---|---|---|---|---|
| B | C | D | Upper Order | Lower Order |
| 1 | 1 | 1 | 1 | 1 |
| 1 | 1 | 0 | 1 | 0 |
| 1 | 0 | 0 | 0 | 1 |
| 0 | 0 | 0 | 0 | 0 | being created based on comparison results (B), (C), and (D) among comparison results (A)–(E) that were input and the values within the register are successively decided at 2 bits each according to said digital value.

When all bits are decided, the value of said register is output from terminals $17_1$–$17_n$ as digital voltage data via output latch 16.

The operation of this A/D converter 12 will be explained. A case of converting input voltage $A_{in}$ into digital voltage data of 8 bits by executing a 2-bit conversion with one comparison operation, using maximum and minimum comparison voltages $DA_1$ and $DA_5$ as the discriminating comparison voltages and three comparison voltages $DA_2$–$DA_4$ as the calculating comparison voltages will be explained.

Even in this example, the assumption will be made that reference voltage $V_{ref}$ is defined as $$V_{ref} = V_T - V_B$$

and $V_B$ is zero V ($V_{ref} = V_T$). Also, the values within the register will be successively decided at 2 bits each from the bit position of uppermost order towards the lower order bits.

The processing procedure is the same as the flow chart shown in FIG. 2. In Step $S_1$, controller 11 outputs an initialization signal with respect to the outer circuits in addition to error collector 15 to initialize each part. At this time, the register of 8 bits within error collector 15 is set to "00000000" and the first comparison voltage difference W is set to $\frac{1}{4} V_{ref}$.

In Step $S_2$, the deciding bit position is set to a total of 2 bits in the uppermost order bit and the second bit.

In Step $S_3$, the value of the deciding bit position of the register is made equal to "10" (the value of the register becomes "10000000").

Even in this A/D converter 12, it is composed for one voltage value to be decided with the value of the register and for the voltage value to become $\frac{1}{256} V_{ref}$, $\frac{2}{256} V_{ref}$, $\frac{3}{256}$, ..., $\frac{255}{256} V_{ref}$ respectively with respect to "00000001," "00000010," "00000011," ... "11111111."

In Step $S_4$, the voltage values of calculating comparison voltages $DA_2$–$DA_4$ are set from the content of the register and the comparison voltage difference W.

Presently, the content of the register is "10000000" and calculating comparison voltage $DA_3$, which becomes the center, is set to $\frac{128}{256} V_{ref}$ ($=\frac{1}{2} V_{ref}$) corresponding to the value of said register. The comparison voltage difference is $\frac{1}{4} V_{ref}$ and calculating comparison voltages $DA_2$ and $DA_4$ are set to the voltage value varied by only the comparison voltage breadth with respect to the voltage value corresponding to the value of the register. Ultimately, comparison voltages $DA_2$–$DA_4$ are set to $DA_4 = \frac{3}{4} V_{ref}$
$DA_3 = \frac{2}{4} V_{ref}$
$DA_1 = \frac{1}{4} V_{ref}$ Next, in Step $S_5$, discriminating comparison voltages $DA_1$ and $DA_5$ are set to $DA_5 = \frac{4}{4} V_{ref}$
$DA_1 = \frac{0}{4} V_{ref}$ being out of the range of comparison voltages $DA_1$–$DA_3$ by only the comparison voltage breadth. Ultimately, comparison voltages $DA_1$–$DA_5$ are set to $DA_5 = \frac{4}{4} V_{ref}$
$DA_4 = \frac{3}{4} V_{ref}$
$DA_3 = \frac{2}{4} V_{ref}$
$DA_2 = \frac{1}{4} V_{ref}$
$DA_1 = \frac{0}{4} V_{ref}$ In Step $S_6$, unit comparators 13a–13e respectively compares input voltage $A_{in}$ with comparison voltages $A_1$–$A_5$ and obtain first comparison results $A_1$, $B_1$, $C_1$, $D_1$, and $E_1$.

Even in this applied mode, comparison results A, B, C, D, and E are made equal to "1" when input voltage $A_{in}$ is large and "0" when said voltage is small.

In Step $S_7$, the digital value of 2 bits is formed using the data shown in aforementioned Table I and using the values of comparison results B, C, and D of calculating comparison voltages $DA_2$–$DA_4$, and with this being temporarily decided as the value of the deciding bit position (here, the uppermost order 2 bits).

Next, in Step $S_8$, it is discriminated as to whether comparison results A–E are normal or abnormal. In the case of normal, the transition is made to Step $S_9$ from Step $S_8$. On the other hand, if it is discriminated as abnormal, the transition is made to Step $S_{20}$.

An assumption will be made that input voltage $A_{in}$ is always at a potential between $V_B$ and $V_T$, that the first comparison result is normal, and the transition is made to Step $S_9$.

In Step $S_9$, the value of the deciding bit position that was temporarily decided is how formally decided. The value temporarily decided in Step $S_7$ is formally decided as is since it does not pass through the correction routine in Step $S_{20}$.

Next, in Step $S_{10}$, whether or not all the values of the register have been decided is discriminated. Here, the transition is made to Step $S_{11}$ since only the uppermost order 2 bits are decided, the decision bit position is shifted to the lower order side by only 2 bits, and the deciding bit position is made into 2 bits, which are the third bit and the fourth bit.

Next, in Step $S_{12}$, the comparison voltage difference is made equal to $\frac{1}{2^d}$. In this embodiment, the digital voltage data are decided at 2 bits each, so d is 2. Therefore, the comparison voltage difference becomes $\frac{1}{4}$ every time it passes through Step $S_{12}$. At this time, comparison voltage difference W becomes $\frac{1}{16} V_{ref}$.

Next, the process is returned to Step $S_3$. In this Step $S_3$, the value of the register at the deciding bit position (third and fourth bits from the uppermost order) is made equal to "10."

In Steps $S_4$ and $S_5$, comparison voltages $DA_1$–$DA_5$ are set from comparison voltage difference W and the value of the register.

If presently the uppermost order 2 bits in the register equal "10," the value of the register becomes "10100000" if the values of the third and fourth bits are equal to "10" in Step $S_3$. Calculating comparison voltage $DA_3$ at the center is set to the voltage value ($DA_3 = \frac{160}{256} V_{ref} = \frac{10}{16} V_{ref}$) that corresponds to the level thereof, the other comparison voltages $DA_1$, $DA_2$, $DA_4$, and $DA_5$ are set from comparison voltage difference ($=\frac{1}{16} V_{ref}$) and the value of the register, and ultimately comparison voltages $DA_1$–$DA_5$ are set to $DA_5 = \frac{12}{16} V_{ref}$
$DA_4 = \frac{11}{16} V_{ref}$
$DA_3 = \frac{10}{16} V_{ref}$
$DA_2 = \frac{9}{16} V_{ref}$
$DA_1 = \frac{8}{16} V_{ref}$ On the other hand, if the uppermost order 2 bits equal to "01," the value of the register becomes "01100000" (the corresponding voltage value is $^{6}/_{16}$ $V_{ref}$) and comparison voltages $DA_1$–$DA_5$ are set to $DA_5 = ^{8}/_{16}$ $V_{ref}$
$DA_4 = ^{7}/_{16}$ $V_{ref}$
$DA_3 = ^{6}/_{16}$ $V_{ref}$
$DA_2 = ^{5}/_{16}$ $V_{ref}$
$DA_1 = ^{4}/_{16}$ $V_{ref}$ Regardless of which voltage values comparison voltages $DA_1$–$DA_5$ have been set to, unit comparators 13a–13e compare input voltage $A_{in}$ with the set comparison voltages $DA_1$–$DA_5$ in the next Step $S_6$ and output the results as second comparison results $A_2$, $B_2$, $C_2$, $D_2$ and $E_2$. In Step $S_7$, the digital value of 2 bits is obtained from Table I and from comparison results ($B_2$), ($C_2$), and ($D_2$); this is temporarily decided as the value of the deciding bit position (2 bits, which are the third and fourth bits) of the register.

Next, in Step $S_8$, the normality of the comparison result is discriminated. A transition is made to Step $S_9$ if input voltage $A_{in}$ is within the range of present comparison voltages $DA_1$–$DA_5$ and if the comparison result is normal; a transition is made to Step $S_{20}$ if that is abnormal.

The result is discriminated as abnormal when comparison result A of discriminating comparison voltage $DA_1$ among comparison results A–E is "0" (in this case, A–E are all "0") or if the comparison result (E) of discriminating comparison voltage $DA_5$ is "1" (in this case A–E are all "1").

Here, an assumption is made that the comparison result was normal, and a transition is made to Step $S_9$ from Step $S_8$.

In this Step $S_9$, the value of the deciding bit position is formally decided, then a transition is made to Step $S_{10}$ and it is discriminated as to whether it is the end. Presently, it is not the end so a transition is made to Step $S_{11}$. The deciding bit position is shifted to the lower order bit side in this Step $S_{11}$ and is made into the fifth bit and the sixth bit. Also, the comparison voltage difference is made into $^{1}/_{64}$ $V_{ref}$, which is ¼ of the previous time, and the process is returned to Step $S_3$.

In Step $S_3$, the 2 bit values of the deciding bit position within error collector 15 are made equal to "10."

If, for example, the 2 bit values of the uppermost order bit and the second bit are "10" and the two bit values of the third bit and the fourth bit are "11," the value of the register becomes "10111000." In Steps $S_4$ and $S_5$, calculating comparison voltage $DA_3$, which becomes the center, is set to a voltage value $(= ^{46}/_{64}$ $V_{ref})$ corresponding to said "10111000" and ultimately comparison voltages $DA_1$–$DA_5$ are set to $DA_5 = ^{48}/_{64}$ $V_{ref}$
$DA_4 = ^{47}/_{64}$ $V_{ref}$
$DA_3 = ^{46}/_{64}$ $V_{ref}$
$DA_2 = ^{45}/_{64}$ $V_{ref}$
$DA_1 = ^{44}/_{64}$ $V_{ref}$ from the comparison voltage difference and said value of the register.

On the other hand, if the 2 bit values of the uppermost order bit and the second bit are "10" and the value of the third bit and the fourth bit are "10," the value of the register becomes "10101000" and the voltage value corresponding to this value is $^{43}/_{64}$ $V_{ref}$, so comparison voltages $DA_1$–$DA_5$ are ultimately set to $DA_5 = ^{45}/_{64}$ $V_{ref}$
$DA_4 = ^{44}/_{64}$ $V_{ref}$
$DA_3 = ^{43}/_{64}$ $V_{ref}$
$DA_2 = ^{42}/_{64}$ $V_{ref}$
$DA_1 = ^{41}/_{64}$ $V_{ref}$ Even if the two bit values of the uppermost order bit and the second bit are "01," comparison voltages $DA_1$–$DA5$ are similarly set from comparison voltage W and the value of the register in Step $S_5$. When comparison voltages $DA_1$–$DA_5$ are set in this way, input voltage $A_{in}$ is compared with comparison voltages $DA_1$–$DA_5$ set by unit comparators 13a–13e in Step $S_6$, third comparison results $A_3$, $B_3$, $C_3$, $D_3$, and $E_3$ are obtained, a digital value is formed according to Table I and comparison results $B_3$, $C_3$, and $D_3$, and the 2 bit value in the deciding bit position of the register is temporarily decided as said digital value.

As explained above, the value of the register is decided at 2 bits each using the three calculating comparison voltages $DA_2$–$DA_4$. When the lowermost order 2 bits (seventh bit and the eighth bit) are formally decided, it is discriminated as being the end in Step $S_{10}$, the process makes the transition to Step $S_{15}$, the content of said register is output as digital voltage data via output latch 16, and the conversion process ends.

Next, processing for a case in which it was discriminated that the comparison result is abnormal in Step $S_8$ and in which the transition was made to Step $S_{20}$ will be explained.

The correction routine in this Step $S_{20}$ is used when correcting the bits in positions other than the uppermost order 2 bits, and an assumption will be made that true input voltage $A_{in}$ is in the following range $DA_1 - W < A_{in} < DA_1$ (when comparison result A is "0")

$DA_5 < A_{in} < DA_5 + W$ (when comparison result C is "1")

based on present comparison voltages $DA_1$ and $DA_5$ and present comparison voltage width W when the comparison result is abnormal, with the range of the next comparison voltages $DA_1$–$DA_5$ being set to a range of said $DA_1 - W - DA_1$ or $DA_5 - DA_5 + W$.

Figure 5:
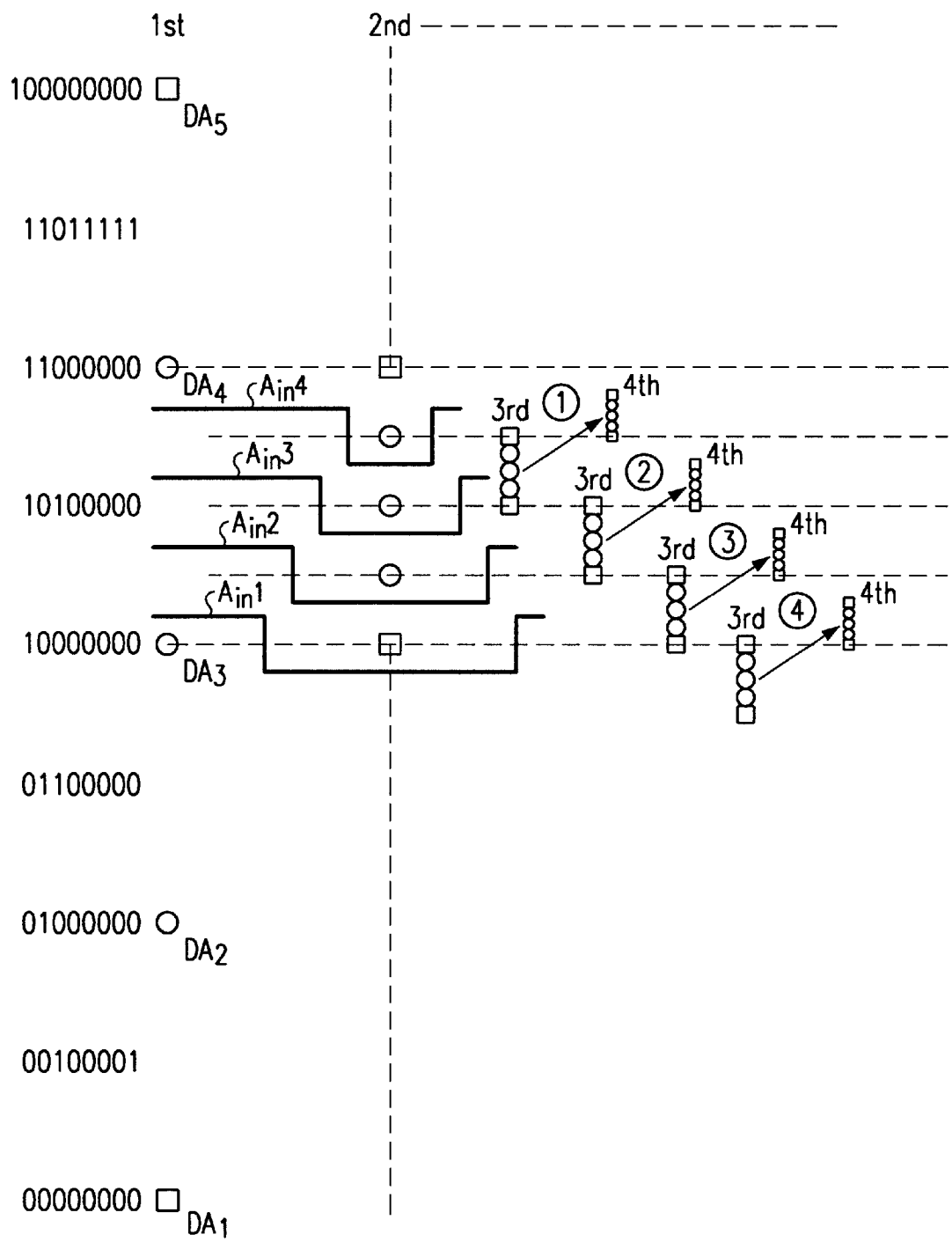
FIG. 5: A figure for explaining an example of the transition in the comparison voltage of said A/D converter.
Figure 6:
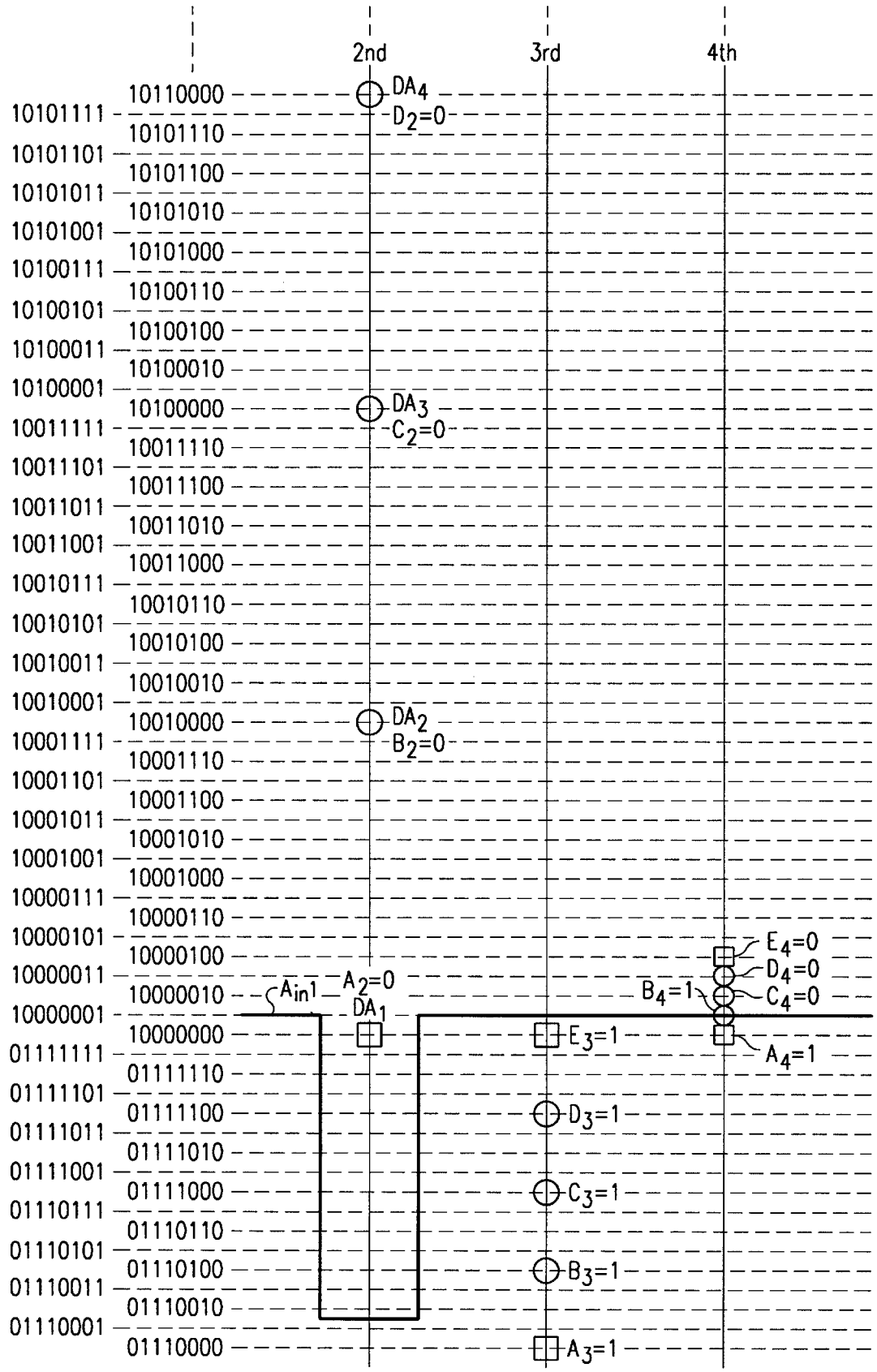
FIG. 6: An enlarged figure for explaining the transition of input voltage $A_{in1}$ in FIG. 6.
Figure 7:
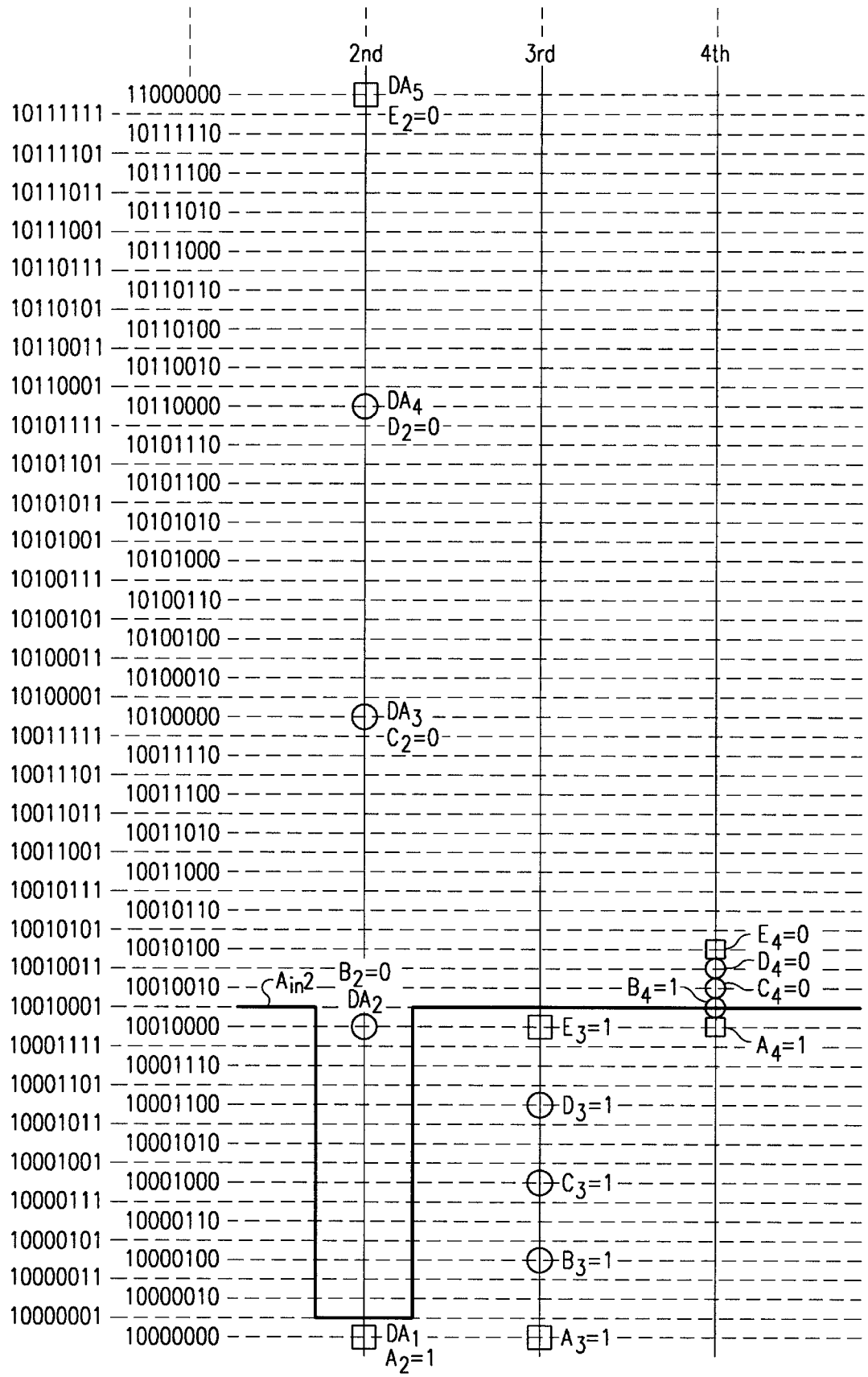
FIG. 7: An enlarged figure for explaining the transition of input voltage $A_{in2}$ in FIG. 6.
Figure 8:
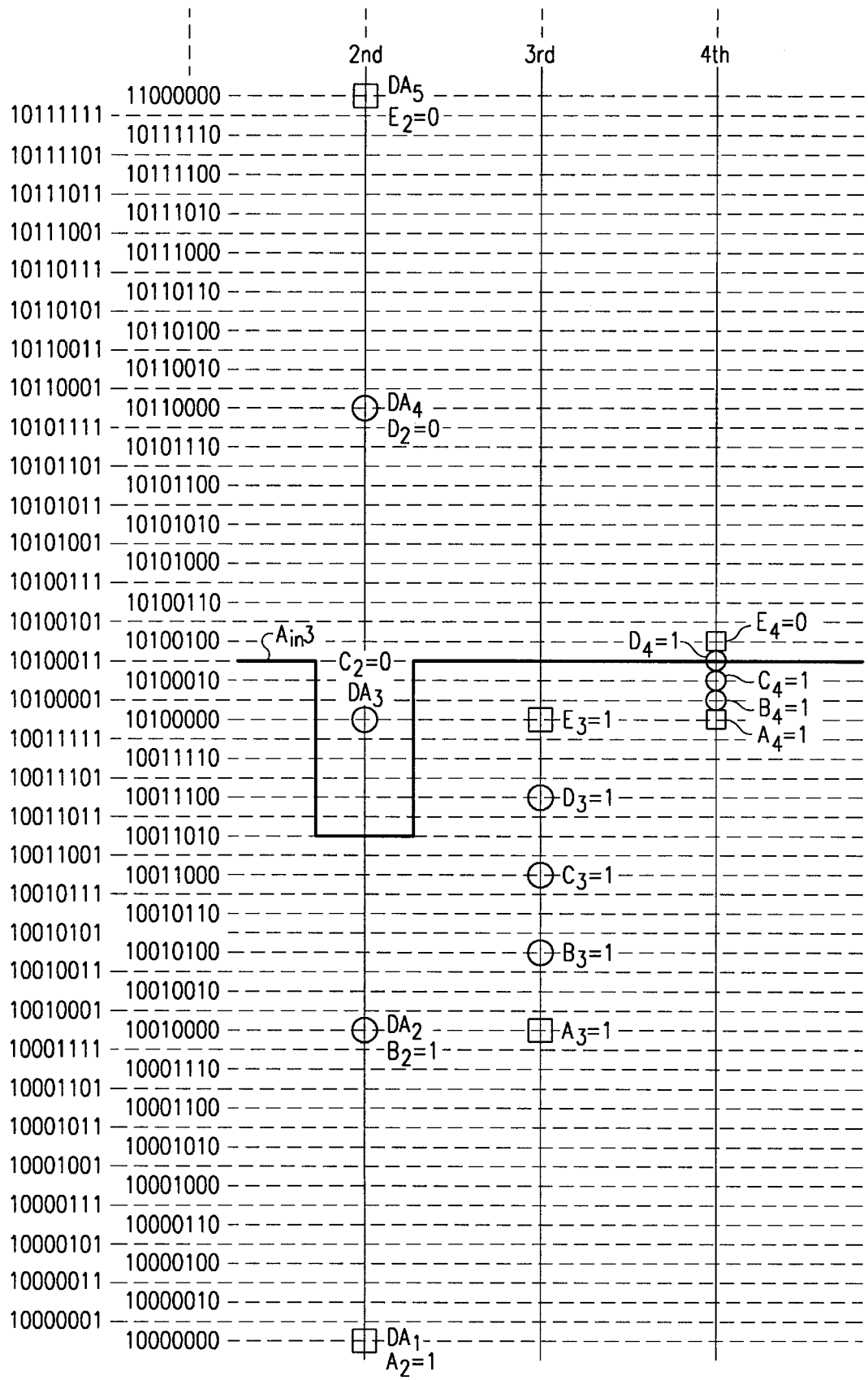
FIG. 8: An enlarged figure for explaining the transition of input voltage $A_{in3}$ in FIG. 6.
Figure 9:
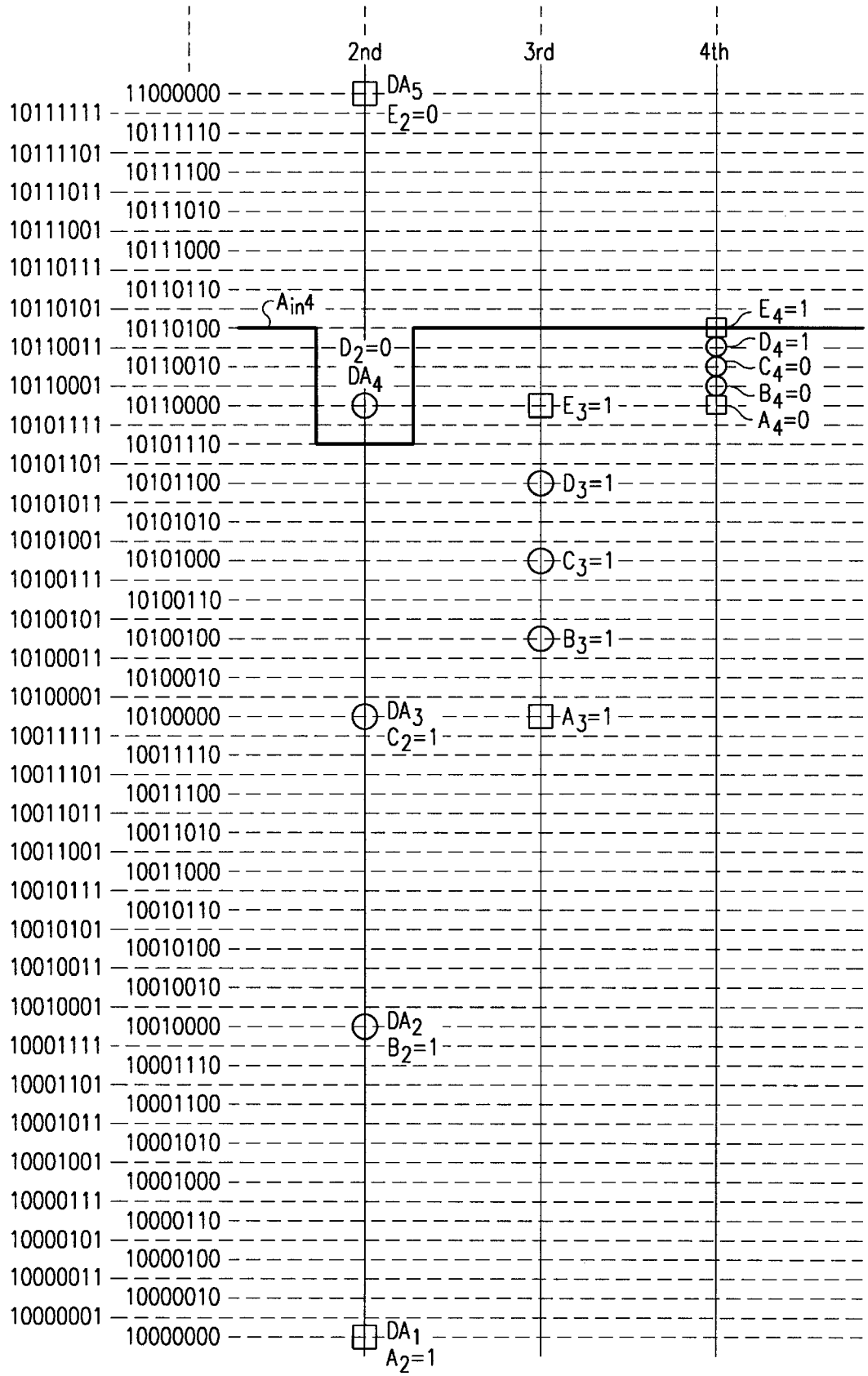
FIG. 9: An enlarged figure for explaining the transition of input voltage $A_{in4}$ in FIG. 6.

This correction method will be concretely explained by separating the comparison miss of the input voltage into cases of four input voltages of $A_{in1}$–$A_{in4}$ using FIG. 5 and FIGS. 6–9, which are partially enlarged figures of FIG. 5.

An assumption will be made that input voltages $A_{in1}$–$A_{in4}$ are respectively within $DA_3$–$DA_4$ during the first comparison (1st) with a normal comparison result being obtained, but input voltages $A_{in1}$–$A_{in4}$ are smaller than the true value during the second comparison with comparison results of $DA_3 < A_{in4} < DA_4$
$DA_2 < A_{in3} < DA_3$
$DA_1 < A_{in2} < DA_2 < A_{in1} < DA_1$ being obtained with respect to what are $DA_4 < A_{in4} < DA_5$
$DA_3 < A_{in3} < DA_4$
$DA_2 < A_{in2} < DA_3$
$DA_1 < A_{in1} < DA_2$ when it is normal with respect to second comparison voltages $DA_{1-DA4}$.

With regard to input voltages $A_{in2}$–$A_{in4}$ among said input voltages $A_{in1}$–$A_{in4}$, the comparison result is normal in the second comparison, so third comparison voltages $DA_1$–$DA_5$ are set based on said comparison result and are shown in positions ①–③ in FIG. 5.

On the other hand, with regard to input voltage $A_{in1}$, comparison result A becomes "0" (A–E are all "0") in the second comparison, the comparison result is discriminated as abnormal, and the comparison voltage set the third time becomes the position of ① in FIG. 5 (maximum comparison voltage $DA_5$ among the third comparison voltages corresponds with minimum comparison voltage $DA_1$ of the second time). With regard to input voltages $A_{in1}$–$A_{in4}$, the transitions in the third and fourth comparison voltages $DA_1-DA_5$ are shown enlarged in FIGS. 6–9.

In the third comparison, input voltages $A_{in1}-A_{in4}$ are returned to the true voltage values, so the comparison results of input voltages $A_{in1}-A_{in4}$ become "1" for comparison result E regarding all when compared with third comparison voltages $DA_1-DA_5$, with the third comparison result being discriminated as abnormal (with regard to input voltage $A_{in1}$, the comparison result is discriminated as abnormal twice in a row).

Comparison result (E) is "1," so comparison voltages $DA_1-DA_5$ set the fourth time are set for minimum comparison voltage $DA_1$ among these to correspond with maximum comparison voltage $DA_5$ among the third comparison voltages. The fourth comparison result becomes normal with regard to input voltages $A_{in1}-A_{in4}$ and a correction of the comparison miss created the second time (2nd) is thus completed with regard to all input voltages $A_{in1}-A_{in4}$.

As explained above, in this applied mode, the four areas of comparison voltage difference W are created according to three central calculating comparison voltages $DA_2-DA_4$, and the digital voltage data are decided at 2 bits each.

In deciding said 2 bits, two comparison voltages $DA_1$ and $DA_5$ on the outside are not used, and have become redundant, but discriminating comparison voltages $DA_1$ and $DA_5$ are used for discriminating whether the comparison result is normal or abnormal; if it is discriminated that the comparison result is abnormal due to the fluctuation, etc., in input voltage $A_{in}$, the value of the register, which was decided according to a miss in the comparison result, can be corrected as was noted above.

In order to execute said correction, specifically, the following processes are executed in Steps $S_{20}$ and $S_{21}$.

If comparison result (A) is "0" ($A_{in}<DA_1$), "01" is subtracted (there are cases involving the shifting to a lower digit) from the 2 bit values of the previous deciding bit position in Step $S_{20}$, then the 2 bit values of the present deciding bit position are made equal to "11" in Step $S_{21}$.

On the other hand, if comparison result A is "0" ($DA_5<A_{in}$), "01" is added (there are cases involving carrying over to the next digit) to the 2 bit value of the previous deciding bit position in Step $S_{20}$ and the 2 bit value of the present deciding bit position is made equal to "00" in Step $S_{21}$.

Setting of comparison voltages $DA_1-DA_5$ thereafter is correctly executed when the value of the register is corrected, thus an accurate digital voltage data can be obtained.

Figure 10:
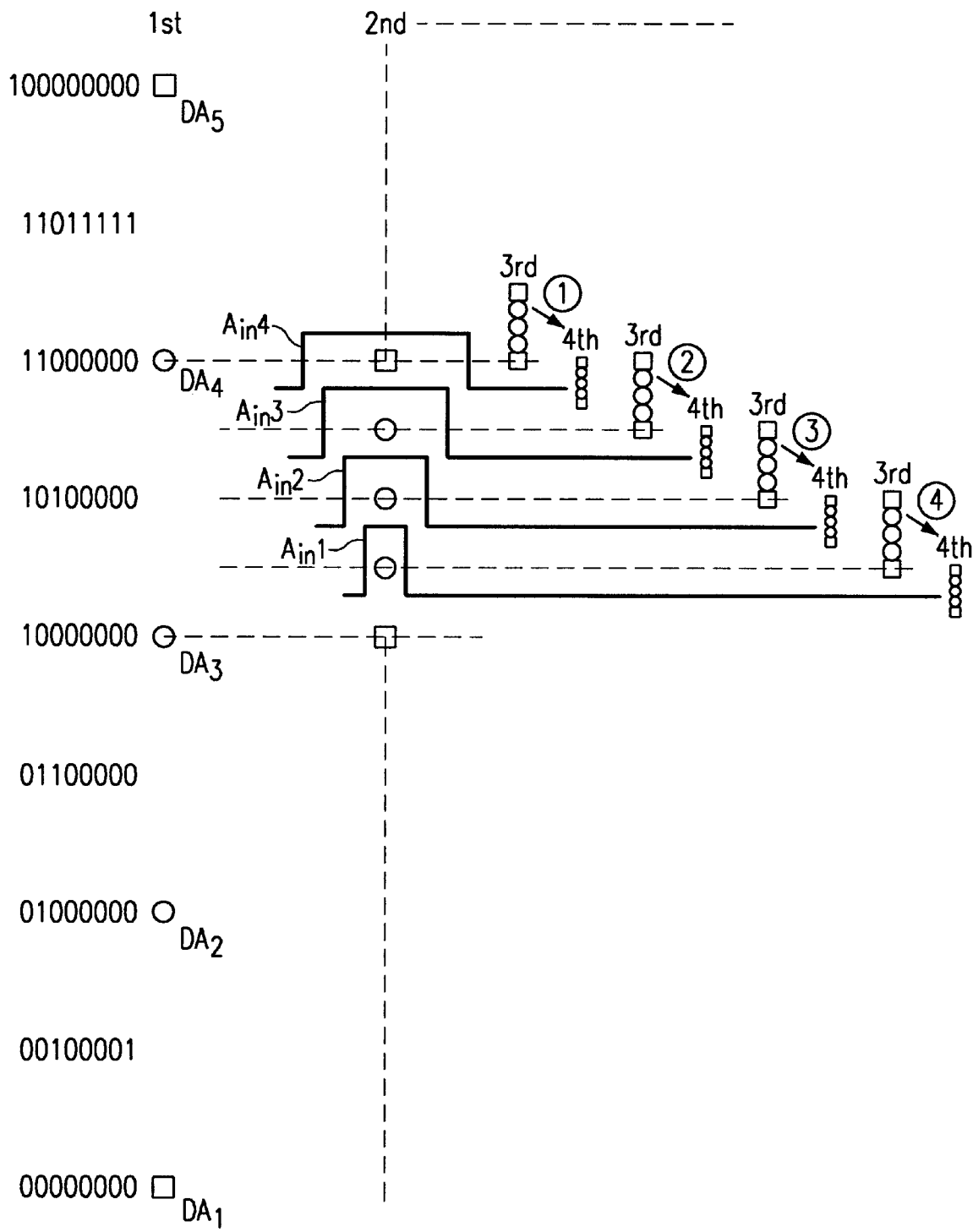
FIG. 10: A figure for explaining another example of the transition in the comparison voltage of the A/D converter in the second example related to the present invention.
Figure 12:
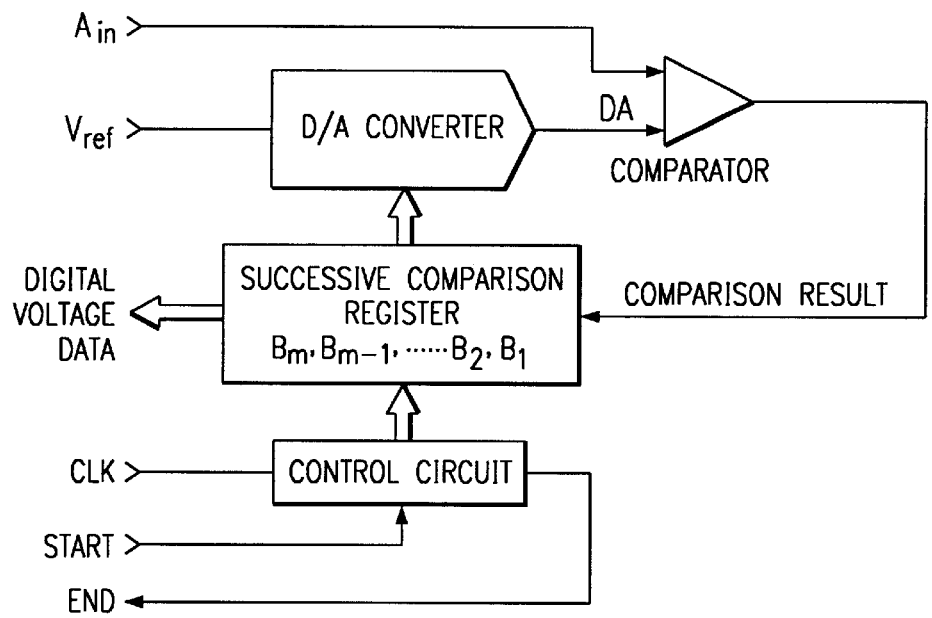
FIG. 12: A block diagram for explaining an A/D converter of the conventional technology.
Figure 13:
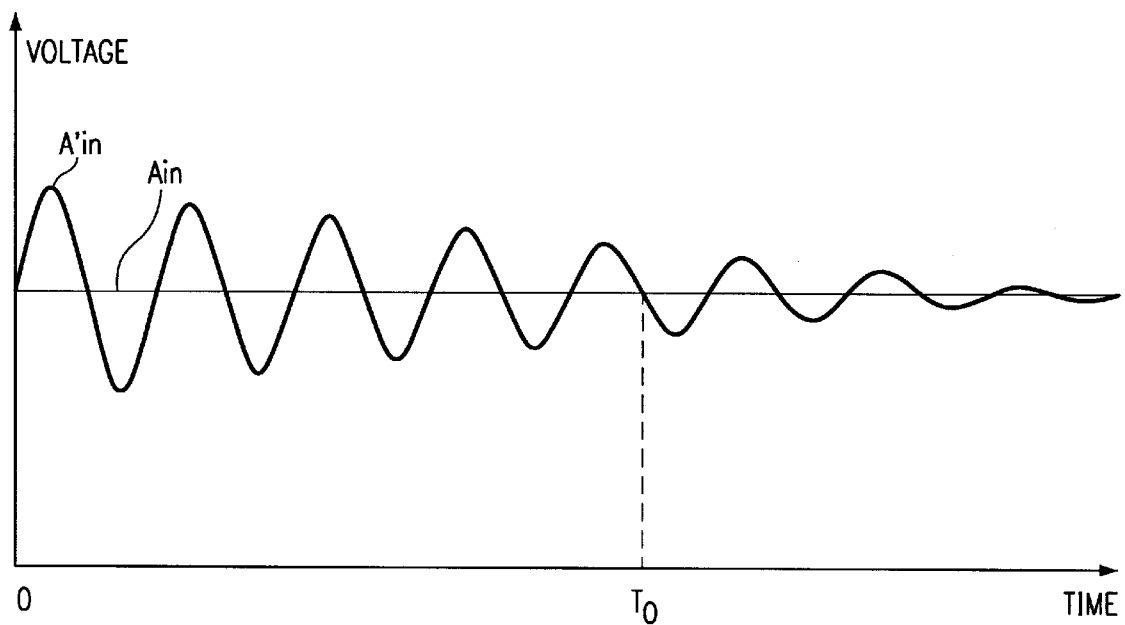
FIG. 13: A graph for explaining the fluctuation in the input voltage.

FIG. 5 is a case in which input voltage $A_{in}$ temporarily decreased during the second comparison, but correct digital voltage data can be similarly obtained even when it has temporarily increased. The transition in comparison voltages $DA_1-DA_5$ in such a case is shown in FIG. 10.

In the applied mode explained above, the comparison miss was corrected by setting two discriminating comparison voltages when obtaining the digital voltage data with the calculating comparison voltage, but needless to say more than four discriminating comparison voltages can be set. However, it is convenient to make the calculating comparison voltage an odd number and the discriminating comparison voltage an even number, and arrange the same number at the top and bottom of the range of the calculating comparison voltages even when arranging multiple calculating and discriminating comparison voltages. Also, in the present invention, the digital voltage data are decided at 2 bits each, but it is possible for it to be composed so as to decide the proper level according to multiple bits each of more than 2 bits, for example, 4 bits each.

In the size relationship between the input voltage and comparison voltage explained above, only a case of being input voltage $A_{in}$<comparison voltage DA or a case of being comparison voltage DA<input voltage $A_{in}$ could be noted and a case of comparison voltage DA=input voltage $A_{in}$ was not discussed, but an explanation was given on the assumption that a size relationship between the comparison voltage DA and input voltage $A_{in}$ is always established in the application of an A/D converter.

When obtaining the digital voltage data of a prescribed system, $2^d-1$ calculating comparison voltages are used and digitalization of the input voltage is executed by obtaining the digital value of d bits from the comparison result thereof, so A/D conversion ends quickly. In such a case, it is not necessary to enhance the speed of the comparator or the D/A conversion circuit, nor to make the circuit scale large.

Even if there is a comparison miss, it is easily possible to change it to the correct value. In such a case, the comparison need not be redone so the speed does not decrease.

Generally, enhancing the precision of the D/A conversion circuit and precision of the comparator is easy, so simply by increasing the comparison frequency, obtaining digital voltage data of many bits becomes possible even if the circuit scale is not made large.

We claim:

1. An A/D conversion method, which is an A/D conversion method for successively deciding the digital data for d bits each by successively comparing an input analog voltage and a comparison voltage, having a first step that sets the digital data containing d bits, to a prescribed value, a second step that forms about $2^d+1$ comparison voltages in a total voltage range in which each value differs based on the digital data, a third step that selects an upper and lower discriminating voltage and a calculating comparison voltage from the comparison voltages and compares the input analog voltage to these three voltages, on the first comparison the upper discriminating voltage is set to the top of the total voltage range and the lower discriminating voltage is set to the bottom of the total voltage range, the difference between the upper and lower discriminating voltage is a comparison voltage range, on subsequent comparisons the upper and lower discriminating voltage and thus the comparison voltage range vary depending on the previous comparison being normal or abnormal, the subsequent comparison voltage range after a normal comparison is a subset of the previous comparison voltage range and the first comparison will necessarily always be normal, a comparison is abnormal if the input analog voltage is greater than an upper discriminating voltage or less than a lower discriminating voltage of a subsequent comparison voltage range due to fluctuation of the input analog voltage, a subsequent comparison voltage range after an abnormal comparison is set outside the range of the previous comparison voltage range;

a fourth step that decides the value of the d bits, based on the comparison result among said comparison voltages when said comparison result is normal, a fifth step that decides the values of the d bits, for this time along with correcting the values of the previous decision bits based on said comparison result when said comparison result is abnormal, a sixth step that discriminates as to whether all of the bits in the digital data have or have not been decided, a seventh step that outputs said decided digital data when all bits of the digital data have been decided, with the processes subsequent to said second step being repeated until the values of all the bits in the digital data are decided.

2. An A/D conversion method noted in claim 1, in which the voltage difference between the upper and lower discrimination voltages selected from the comparison voltages formed in said second step becomes less each time the process is repeated.

3. An A/D conversion method noted in claim 2, in which the voltage difference between the upper and lower discrimination voltages and the comparison voltage formed in said second step becomes $\frac{1}{2}^d$ times the previous value each time the process is repeated, where d' is the number of bits being determined at a time.

4. An A/D conversion method noted in claim 3, in which the voltage differences between the upper and lower discrimination voltages and the comparison voltage formed in said second step are equal.

5. An A/D conversion method for successively deciding the digital data for d bits each by successively comparing an input analog voltage and a comparison voltage, having a first step that sets the digital register containing d bits to a prescribed value, a second step that forms about $2^d+1$ comparison voltages in a total voltage range, a third step that selects an upper and lower discriminating voltage and a calculating comparison voltage from the comparison voltages and compares the input analog voltage to these three voltages, on the first comparison the upper discriminating voltage is set to the top of the total voltage range and the lower discriminating voltage is set to the bottom of the total voltage range, the difference between the upper and lower discriminating voltage is a comparison voltage range, on the second and subsequent comparisons the comparison voltage range is made $\frac{1}{2}^o$ times the previous where d' is the number of bits being decided, if a previous comparison was abnormal, then the comparison voltage range is outside the previous comparison voltage range, where the comparison is abnormal if the input analog voltage is outside a comparison voltage range due to fluctuation of the input analog voltage;

a fourth step that decides the value of the d bits, based on the comparison result among said comparison voltages when said comparison result is normal, a fifth step that decides the values of the d bits, for this time along with correcting the values of the previous decision bits based on said comparison result when said comparison result is abnormal, a sixth step that discriminates as to whether all of the bits in the digital data have or have not been decided, with the processes subsequent to said second step being repeated until the values of all the bits in the digital data are decided.

6. An A/D conversion method for deciding the digital data for d bits by successively comparing an input analog voltage and a comparison voltage comprising steps:

a first step that sets the digital register containing d bits to a prescribed value, a second step that forms comparison voltages in a total voltage range, a third step that selects one or more upper and lower discriminating voltages and a comparison voltage from the total voltage range and compares the input analog voltage to these voltages, the difference between the upper and lower discriminating voltage Is a comparison voltage range, on the first comparison, the comparison voltage range is the total voltage range of the comparator;

a fourth step of repeating the comparison of step three where the comparison voltage range is the top ½ of the total voltage range or the bottom ½ of the total voltage range depending on whether the first comparison voltage was greater or less than the analog input voltage, a fifth step repeating the comparison of step three where the comparison voltage range corresponds to the upper halt or lower half of the previous comparison voltage range if the determination of the previous bit in step four was normal, and when the comparison was abnormal, where the input analog voltage is outside the comparison voltage range due to fluctuation of the input analog voltage, then the comparison voltage range is outside of the previous comparison voltage range and is above the previous comparison voltage range if the input was greater than the upper discrimination voltage and is below the previous comparison voltage range if the input was below the lower discrimination voltage.

* * * * *